United States Patent
Butsch et al.

(10) Patent No.: US 7,030,642 B2
(45) Date of Patent: Apr. 18, 2006

(54) QUICK ATTACHMENT FIXTURE AND POWER CARD FOR DIODE-BASED LIGHT DEVICES

(75) Inventors: Steve M. Butsch, Mechanicsburg, OH (US); Jeffrey M. Singer, Fairborn, OH (US); Nicolo F. Machi, Marysville, OH (US)

(73) Assignee: Honeywell International Inc., Morris Township, NJ (US)

( * ) Notice: Subject to any disclaimer, the term of this patent is extended or adjusted under 35 U.S.C. 154(b) by 140 days.

(21) Appl. No.: 10/773,357

(22) Filed: Feb. 6, 2004

(65) Prior Publication Data
US 2005/0174808 A1 Aug. 11, 2005

(51) Int. Cl.
*G01R 31/22* (2006.01)
(52) U.S. Cl. ............... 324/767; 324/760; 324/755
(58) Field of Classification Search ............ None
See application file for complete search history.

(56) References Cited

U.S. PATENT DOCUMENTS

| 5,134,340 | A | | 7/1992 | Haitz | |
| 5,410,258 | A | | 4/1995 | Bowers et al. | |
| 5,585,695 | A | | 12/1996 | Kitai | 313/500 |
| 5,748,007 | A | * | 5/1998 | Gaschke | 324/755 |
| 5,926,027 | A | * | 7/1999 | Bumb et al. | 324/755 |
| 6,152,762 | A | | 11/2000 | Marshall et al. | 313/506 |
| 6,160,647 | A | | 12/2000 | Gilliland et al. | 439/489 |
| 6,297,654 | B1 | * | 10/2001 | Barabi | 324/755 |
| 6,533,436 | B1 | | 3/2003 | Krietzman et al. | |
| 6,833,563 | B1 | | 12/2004 | Rinaldi et al. | 257/81 |
| 6,850,417 | B1 | | 2/2005 | Cooper et al. | 361/752 |
| 6,948,823 | B1 | | 9/2005 | Pohlert et al. | 362/11 |
| 2001/0040801 | A1 | | 11/2001 | Krietzman et al. | |
| 2003/0020986 | A1 | | 1/2003 | Pang et al. | 359/152 |
| 2003/0123243 | A1 | | 7/2003 | Krietzman et al. | |
| 2003/0152390 | A1 | | 8/2003 | Stewart et al. | 398/135 |

FOREIGN PATENT DOCUMENTS

JP 04095846 A 3/1992

* cited by examiner

*Primary Examiner*—Vinh Nguyen
*Assistant Examiner*—Jimmy Nguyen
(74) *Attorney, Agent, or Firm*—Birch, Stewart, Kolasch & Birch, LLP

(57) ABSTRACT

A quick attachment device for use in the repeated testing of diode light sources (30) includes a quick attachment module (10) having a fixed location with respect to a testing position (150) for the diodes (30), and a mounting assembly (20) on which each diode (30) is mounted during testing. The quick attachment module (10) includes a quick disconnect fastener and two locating pins (120a and 120b) for securing the mounting assembly (20) for testing, where the two locating pins (120a and 120b) have a locational transition fit connection with the mounting assembly (20). The mounting assembly (20) may further include a thermal-electric cooling device (260) for cooling the diode light sources (30) during testing.

19 Claims, 7 Drawing Sheets

QUICK ATTACHMENT FIXTURE AND POWER CARD FOR DIODE-BASED LIGHT DEVICES

FIELD OF THE INVENTION

The present invention is directed to diode-based light devices, and more particularly, to quick attachment testing and power connections for diode-based light devices.

BACKGROUND OF THE INVENTION

A variety of light-emitting devices exist that utilize diode-based light sources. For example, such devices utilize light emitting diodes (LEDs) that are configured to emit visible light, infrared (IR) diodes for emitting IR light, and ultra-violet (UV) diodes for emitting UV light.

In light devices that utilize a diode-based light source, the diode may include pins that are connected to electrical wiring for providing power to the diode. Other devices use surface-mounted diodes, in which each diode is affixed to a mounting plate that includes solder pads. Electrical power connections may be soldered onto these pads to provide the LED power. Examples of such surface-mounted LEDs include the LUXEON™ Star LED module and the LUXEON Star/O LED module, which are currently available on the commercial market.

Various types of testing equipment are used for measuring the performance of LED devices. An example is an integrating sphere, which is a small sphere whose interior surface has a white reflective coating. The sphere is connected via fiber optic cable to a compact array spectrometer. Specifically, an LED device is fixed in relation to an opening of the integrating sphere, and light emitted from the LED device reflects the interior surface to the detector. Accordingly, various measurements of the LED device may be made, including luminous flux, wavelength, chromaticity, and spectral distribution.

To ensure the accuracy of measurements made by an integrating sphere, as well as other types of LED measurement devices, the location of the LED during testing must be known to a high degree of precision. Accordingly, a fixture must be used to secure the LED at a known location relative to the testing equipment.

However, it is also desirable to utilize testing equipment, such as the integrating sphere, to perform repeated measurements on multiple LED devices. However, while conducting repeated testing on a large number of LED devices, the process of securely placing each LED device into testing position with conventional fixtures is very time consuming. Also, another problem exists in that a constant emitter junction temperature must be maintained for each of the LED devices being tested in order to obtain accurate results.

SUMMARY OF THE INVENTION

Exemplary embodiments of the present invention utilize quick disconnect fixtures capable of securely fixing each of a plurality of diode light sources into position for repeatable testing, while providing thermo-electric cooling (TEC) for maintaining each of the tested diode light sources at a constant emitter junction temperature.

According to an exemplary embodiment, a quick attachment device for placing a diode light source into position for repeatable testing includes a quick attachment module having a fixed location with respect to the repeatable testing position, and a mounting assembly on which each diode light source is mounted during testing. The mounting assembly is operably connected to the quick attachment module via a quick disconnect hinge. The mounting assembly includes a thermo-electric cooling device capable of cooling the diode light source being tested. In this exemplary embodiment, the quick attachment module may include two locating pins to provide a locational transition (LT) fit connection between the quick attachment module and the mounting assembly when diode light sources are moved into the repeatable testing position.

In another exemplary embodiment, the mounting assembly includes a thermistor for detecting a temperature of the mounting assembly. The thermoelectric cooling device may be controlled based upon this detected temperature in order to maintain each of the diode light sources at a constant junction temperature during testing.

According to another exemplary embodiment, the mounting assembly may include a thermally insulating module with two slots, each slot configured to receive a corresponding one of the locating pins in an LT fit connection. The thermally insulating module may be comprised of two modular wear blocks, each of which includes one of the slots for receiving the locating pins.

In further exemplary embodiments, the mounting assembly may include other means of dissipating heat. For example, a heat sink may operably connected to a mounting plate on which each diode light source is mounted during testing. In another exemplary embodiment, an electric fan may be connected to the heat sink.

In an exemplary embodiment, the quick attachment module includes another fastener, e.g., a second quick disconnect hinge, to be engaged with a fastening mechanism on the mounting assembly when the diode light sources are moved into fasting position. Based on the LT fit connection between the two locating pins and the thermally insulating module, exemplary embodiments of the present invention need only two fasteners (or quick disconnect hinges) to securely and accurately place each diode light source in testing position when repeatable testing is being performed for a large number of diode light sources. When modular wear blocks (e.g., made of plastic) are used in the thermally insulating module, any eventual loosening of the LT fit can be eliminated by merely replacing these modular wear blocks.

According to an exemplary embodiment, the mounting assembly may include a low-conductive plate, which becomes positioned between the mounting plate and the quick attachment module when a diode light source is moved into testing position. For example, a low-conductive plate may be fastened to the mounting plate of the mounting assembly. A low-conductance material (e.g., semiconductor material) may cover up electrical pathways to the diode light source that provide power during testing. Thus, when the quick attachment module is comprised of a metallic or other electrically conductive material, the low-conductive plate may help prevent short circuiting or electric shocks during testing.

According to an exemplary embodiment, the low-conductive plate may be a power card that provides power, during testing, to a surface-mounted diode light source whose mounting plate includes a solder pad-type power interface. In such an embodiment, the power card may include solder pad contacts that are adaptable to a relative height differential of the solder pads in the surface-mounted diode light source, thereby maintaining contact with these pads. The power card may further include electrically-insulated electrical pathways connecting each solder pad contact to an external power source connector on the power card. In an exemplary embodiment, the electrical pathways are insulated from the quick attachment module by the low-conductance substrate of the power card. The electrical pathways are further electrical insulated from the mounting plate of the diode light source, e.g., with an insulating electrical tape.

The power card may further include flexible tabs, on which each solder pad contact is disposed. The tabs may allow the contacts to adapt to the height differential between the solder pads of the surface-mounted light source. In such an embodiment, each of these tabs is configured to displace its solder pad contact a suitable distance, using spring-loaded tension, in order to maintain contact with the corresponding solder pad of the surface-mounted diode light source.

Further advances in scope of applicability of the present invention will become apparent from the detailed description provided hereinafter. However, it should be understood that the detailed description and specific embodiments therein, while disclosing exemplary embodiments of the invention, are provided by way of illustration only.

BRIEF DESCRIPTION OF THE DRAWINGS

A more complete understanding of the present invention will become apparent in the following description taken in conjunction with the accompanying drawings, wherein.

DETAILED DESCRIPTION OF EXEMPLARY EMBODIMENTS

Exemplary embodiments of the present invention are disclosed in the following description.

The present invention is directed to a device for fixating diode light sources to a specific testing position relative to measurement devices. According to exemplary embodiments, the device has a quick disconnect configuration that allows for the repeated testing of a high number of diode light sources. Furthermore, this fixture device is operable to adjust a junction temperature of each diode light source in order to maintain a constant temperature for all of the light sources being tested.

Exemplary embodiments of the present invention allow for each of the plurality of diode light sources to be quickly attached to the fixture device and moved into testing position. Thus, the fixture device will hereinafter be referred to a "quick attachment device." However, this term is used for purposes of description only and should not be construed as limiting the present invention in any way.

According to an exemplary embodiment, the quick attachment device includes means for providing power to each of the diode light sources during testing. However, the diode light sources being tested may be of the type utilizing solder pad connections to receive power. In such cases, it is usually required for these connections to be soldered to the solder pads located on the diode light sources, which could be a very time consuming process. Thus, an exemplary embodiment of the present invention includes a diode light source power card that obviates the need for soldering power connections to diode light sources utilizing solder pads.

Figure 1:
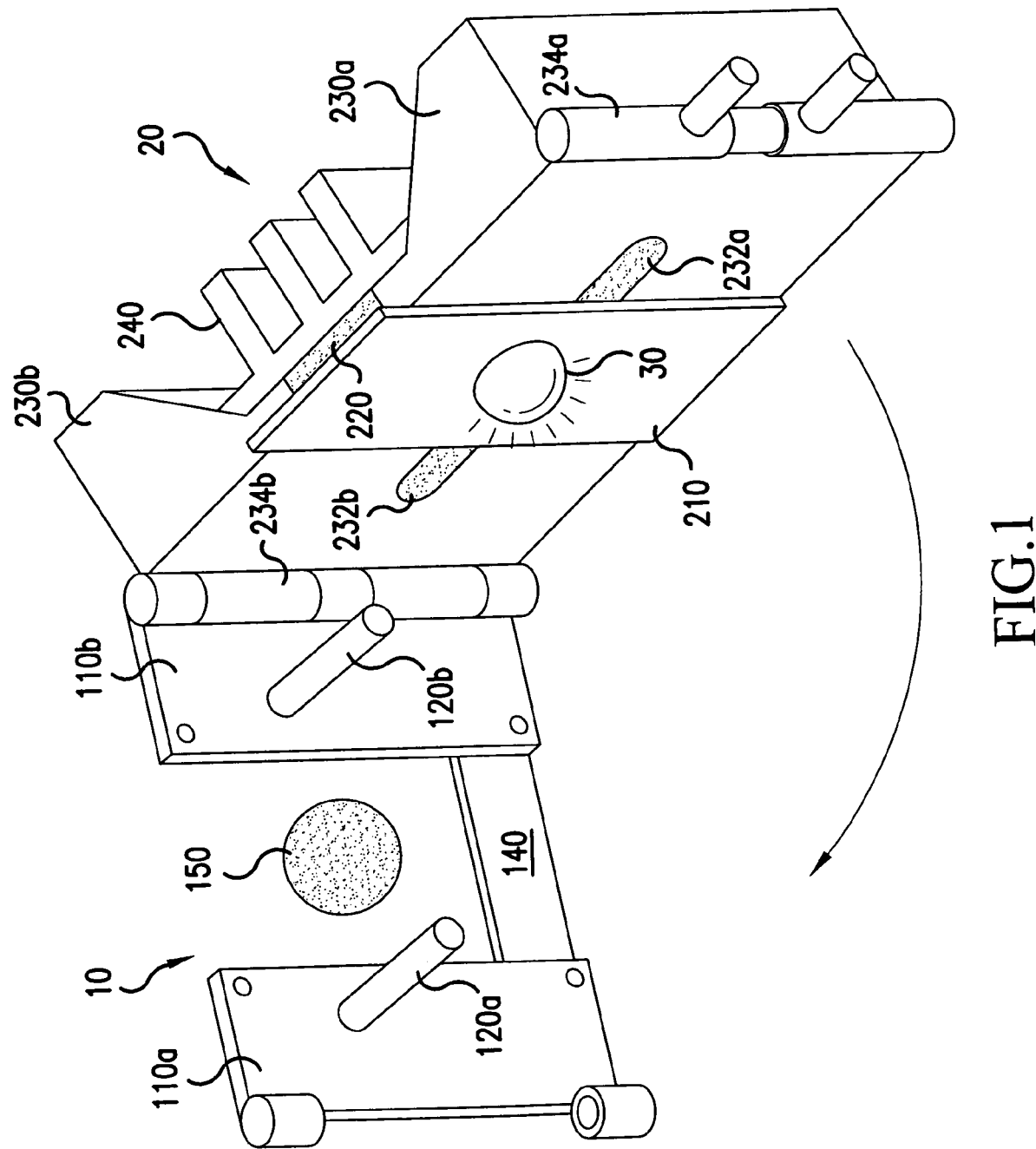
FIG. 1 illustrates the various components of the quick attachment device before a diode light source is moved into repeatable testing position, according an exemplary embodiment of the present invention.

FIG. 1 illustrates the various components of a quick attachment device, according to an exemplary embodiment of the present invention. Specifically, FIG. 1 illustrates a quick attachment module 10, whose location is fixed with respect to a repeatable testing position 150. Each diode light source 30 is to be located at position 150 during testing. FIG. 1 shows that the quick attachment module 10 includes quick disconnect hinges 110A and 110B and a connection 140. The connection 140 keeps the quick disconnect hinges 110A and 110B at pre-determined positions with respect to one another. Attached to each quick disconnect hinge 110A, 110B is a corresponding one of the locating pins 120A and 120B.

FIG. 1 further illustrates a mounting assembly 20, on which a particular diode light source 30 is mounted during testing. According to an exemplary embodiment, the diode light source 30 being tested may be a light emitting diode (LED) configured to illuminate visible light, infrared (IR) light, or ultraviolet (UV) light. Furthermore, the diode light source 30 may be another type of device, such as an IR diode, a laser diode, or an IR laser diode.

FIG. 1 further illustrates the mounting assembly 20 as including module wear blocks 230A and 230B, each of which includes one of the slots 232A and 232B. Each wear block 230A, 230B includes a fastening mechanism 234A, 234B, which is operable to engage with a corresponding one of the quick disconnect hinges 110A and 110B at the quick attachment module 10. For example, FIG. 1 illustrates fastening mechanism 234B in engagement with the quick disconnect hinge 110B, such that mounting assembly 20 can be moved in relation to the quick attachment module 10 to place that diode light source 30 at the repeatable testing position 150.

FIG. 1 further shows a low-conductive plate 210, a mounting plate 220, and a heat sink 240. The low-conductive plate 210 may be comprised of any material that exhibits little or no electrically conductive properties. For example, the low-conductive plate 210 may be formed of semiconductor material, which is normally used as the semiconductor substrate of a printed circuit board (PCB). This low-conductive plate 210 may also be produced with a white (or reflective) coating on the surface that mounts against the integrating sphere. This reflective coating will aid in diverting an increased amount of light to the sphere's light detector.

Although not shown in FIG. 1, the mounting assembly 20 may further include a thermoelectric cooling (TEC) device connected to the mounting plate 220, and other ancillary cooling devices connected to the heat sink 240, such as an electric fan.

Figure 1A:
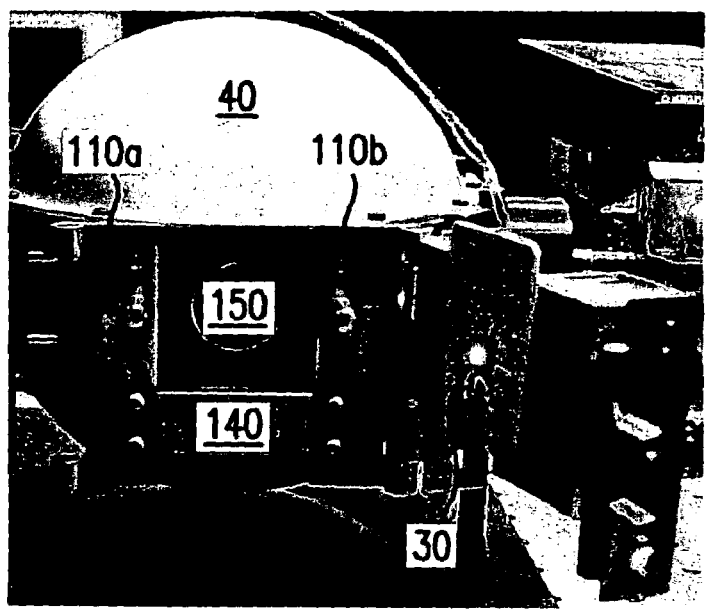
FIGS. 1A and 1B illustrate the various components of the quick attachment device before a diode light source is moved into repeatable testing position, where an integrating sphere is used to perform testing, according to an exemplary embodiment of the present invention.
Figure 1B:
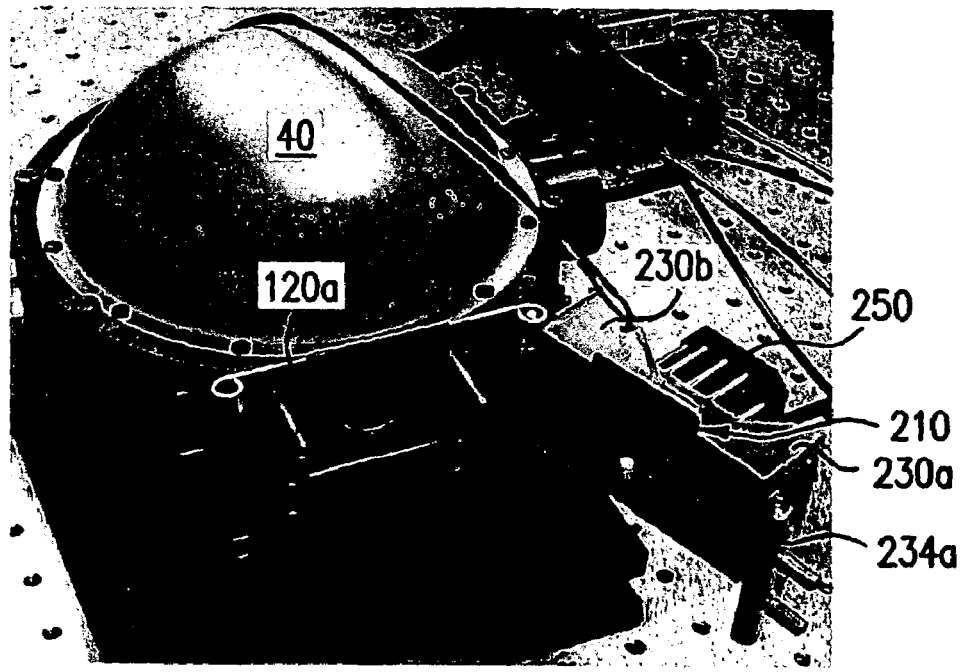

FIGS. 1A and 1B similarly illustrate the quick attachment device in an "open" position, at which the diode light source 30 has not been moved into the testing position 150. FIGS. 1A and 1B show a particular exemplary embodiment, where the quick attachment device is used for positioning diode light sources 30 for testing by an integrating sphere 40. FIG. 1B further illustrates the position of an electric fan 250 connected to heat sink 240.

Figure 2:
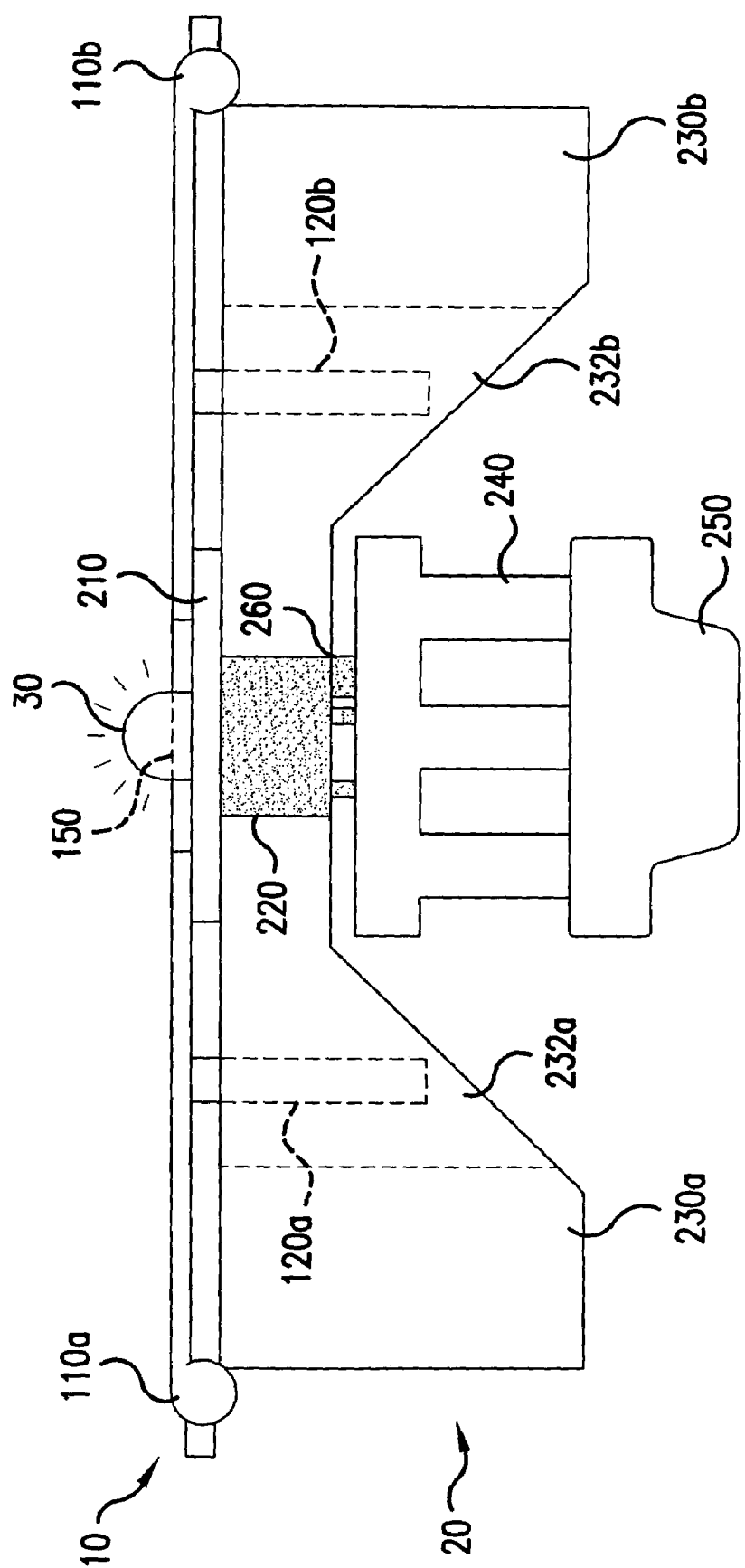
FIG. 2 illustrates the various components of the quick attachment device when the diode light source is in repeatable testing position, according an exemplary embodiment of the present invention.

FIG. 2 illustrates a top view of the quick attachment device in a "closed" position, where the diode light source 30 is placed at the repeatable testing position 150, according to an exemplary embodiment.

Figure 2A:
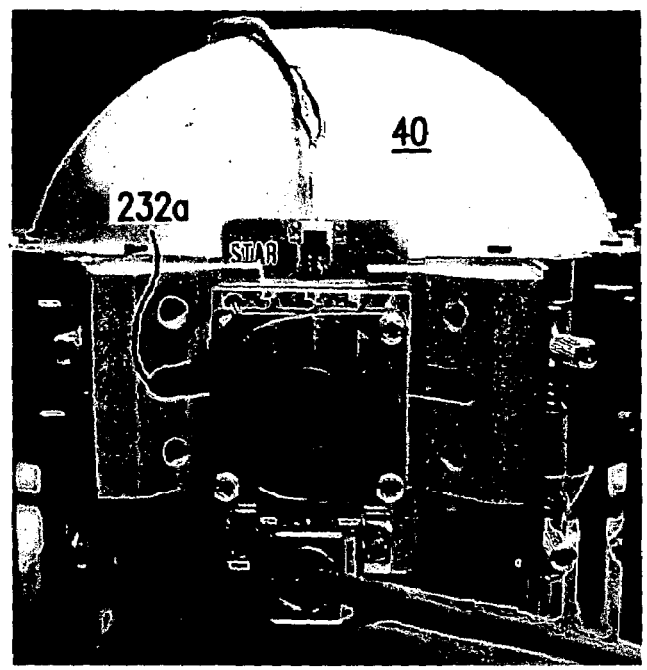
FIGS. 2A and 2B illustrate the various components of the quick attachment device when the diode light source is in repeatable testing position for testing with an integrating sphere, according to an exemplary embodiment of the present invention.
Figure 2B:
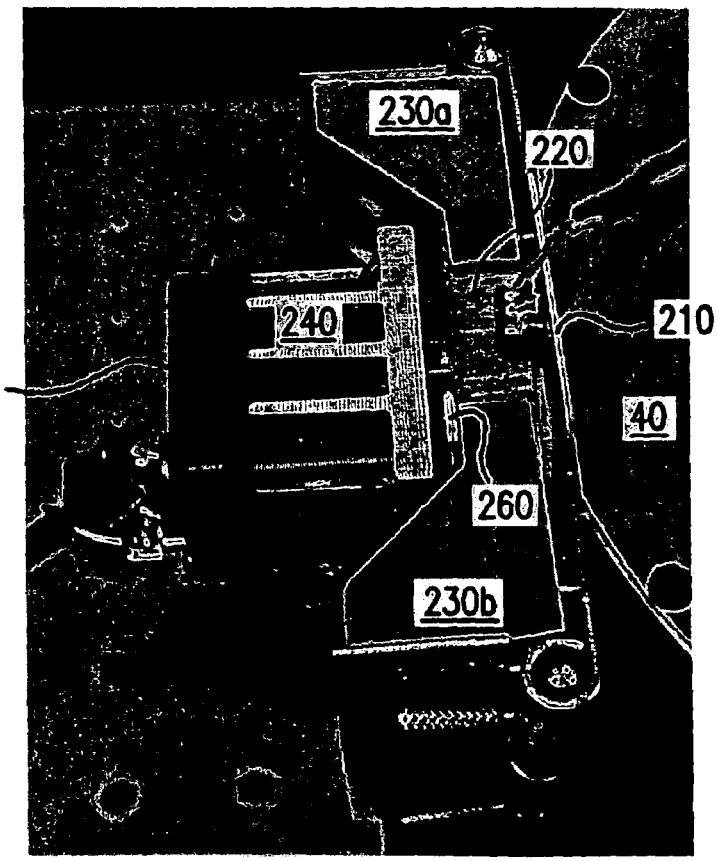

FIGS. 2A and 2B further illustrate the quick attachment device in the closed position, according to a particular exemplary embodiment where testing is performed by an integrating sphere 40.

FIGS. 1–2B are provided for purposes of illustration only. These figures are not intended to show, with any precision, the relative dimensions, sizes, and shapes of the various components. For example, the size of certain components may be exaggerated in relation to other components to more clearly illustrate them. It should also be noted that various modifications may be made to the configuration shown in these figures without departing from the spirit and scope of the invention, as will be contemplated by those of ordinary skill in the art.

Operation of the quick attachment device according to the exemplary embodiments shown in FIGS. 1–2B will be described below.

The quick attachment module 10 includes two quick disconnect hinges 110A and 110B, each of which includes a corresponding one of the locating pins 120A and 120B. These components allow for the mounting assembly 20 to be quickly attached to the quick attachment module 10 according to a locational transition (LT) fit connection between the locating pins 120A and 120B and the slots 232A and 232B of the mounting assembly 20. Each of the quick disconnect hinges 110A and 110B of the quick attachment module 10 are engaged with a corresponding one of fastening mechanisms 234A and 234B on the mounting assembly 20. For example, the length of each of the fastening mechanisms 234A and 234B may be compressed by squeezing the illustrated handles so that the fastening mechanism will fit within the corresponding hinge 110A, 110B. FIG. 1 particularly shows the engagement between quick disconnect hinge 110B and fastening mechanism 234B.

As shown in FIG. 1, the mounting assembly 20 may be rapidly moved into testing position with respect to quick attachment module 10 by keeping a set of one quick disconnect hinge and one fastening mechanism engaged during repeated testing (as shown in FIG. 1 in connection with hinge 110B and mechanism 234B). This allows the quick attachment device to be repeatedly opened and closed by rotating the mounting assembly 20 about the axis created by the engaged quick disconnect hinge (110B) and fastening mechanism (234B). When the mounting assembly 20 is rotated into the closed position, the other set of quick disconnect hinge (110A) and fastening mechanism (234A) may be engaged to secure the diode light source 30 into the repeated testing position 150.

It should be noted that the quick attachment module 10 and mounting assembly 20 may include other types of quick disconnect mechanisms, as will be contemplated by those of ordinary skill in the art. For example, the two quick disconnect hinges 110A and 110B of quick attachment module 10 may be replaced with any type of fixture that includes two locating pins 120A and 120B and two fasteners or latches, capable of quickly being fastened and unfastened with corresponding parts of the mounting assembly 20 during repeated testing. Such configurations may include one quick disconnect hinge, utilized in combination with another type of fastener.

As stated above, FIG. 2 illustrates a situation where the quick attachment device is in the closed position for testing. FIG. 2 illustrates locating pins 120A and 120B using dotted lines to indicate that they are currently inserted in the corresponding slots 232A and 232B (represented in FIG. 2 as shaded areas), thereby providing an LT fit connection.

According to an exemplary embodiment, the slots 232A and 232B may be located within a thermally insulating module at the mounting assembly 20. In the exemplary embodiments as shown in FIGS. 1–2B, the thermally insulating module is comprised of two modular wear blocks 230A and 230B, each of which includes a corresponding one of the slots 232A and 232B. The wear blocks 230A and 230B may be formed of a thermally insulating material, such as plastic, which allows for an LT fit with the locating pins 120A and 120B.

Prolonged repeated testing at diode light sources 30 using the quick attachment device may cause the LT fit connection to loosen, based on the wear on the slot 232A and 232B. Accordingly, the modular wear blocks 230A and 230B may be easily replaced when such loosening occurs. The use of relatively inexpensive materials facilitates the replacement of the modular wear blocks 230A and 230B when needed.

Although the above embodiments describe the locating pins 120A and 120B as having an LT fit connection with the corresponding slots 232A and 232B, it should be noted that the present invention covers other types of fits. The type of connection fit between the locating pins 120A, 120B and slots 232A, 232B may be any one of a location clearance fit, locational interference fit, a press fit, etc. However, this list is not exhaustive, and any other suitable connection fit may be used, as will be contemplated by those of ordinary skill in the art.

FIGS. 2 and 2B show that the mounting assembly 20 includes a thermo-electric cooling (TEC) device 260, positioned between the heat sink 240 and the mounting plate 220. According to an exemplary embodiment, the diode light source 30 is affixed to a mounting plate 220. For example, the diode light source 30 and mounting plate 220 may be incorporated in a commercially available surface-mounted LED, such as the LUXEON Star or Star/O emitter. During testing operation, heat generated by the diode 30 is transferred to the mounting plate 220. The connection(s) between the mounting plate 220 and the heat sink 240 allow for the heat sink 240 to dissipate this heat. According to exemplary embodiments, the mounting plate 220 may include one primary connection or multiple connections (as shown in FIG. 2) to the heat sink 240. Various ways of connecting the mounting plate 270 to the heat sink 240 will be readily known to those of ordinary skill in the art.

The function of the TEC device 260 is to further cool the mounting plate 220 as heat is being generated during testing, in order to maintain a constant junction temperature for the plurality of diode light sources 30. According to an exemplary embodiment, a thermistor (not shown) may be included in the mounting assembly 20 to detect the temperature of the mounting plate 220. For example, the thermistor may be directly attached to the mounting plate 220. Signals from the thermistor may be sent to a control unit (not shown). The control unit may be a processor located somewhere on the quick attachment device or, alternatively, positioned at a remote location. Based on the signals from the thermistor, the control unit may control the operation of the TEC device 260, for example, by controlling the TEC device 260 to turn on and off. The control unit may also be configured to control other operations of the TEC device 260 such as the degree of cooling.

The mounting assembly 20 may further include an electric fan 250 connected to the heat sink 240, as illustrated in FIGS. 2–2B, in order to provide additional cooling. Other various cooling devices may further be attached to the mounting assembly 20 in addition to or in place of the electric fan 250, according to exemplary embodiments.

As described above, the low-conductive plate 210 may be positioned on the mounting assembly 20, so as to cover the front of the mounting plate 220. Accordingly, when the quick attachment device is in the closed position, as illustrated in FIGS. 2–2B, the low-conductive plate 210 is placed in abutment with the quick attachment module 10.

In such an embodiment, the mounting plate 220 does not have direct contact with the quick attachment module 10. Accordingly, when the quick attachment module 10 and the mounting plate 220 are made of electrically conductive material (e.g., metal), the low-conductive plate 210 protects against potential electric shocks or short circuits during testing of diode light sources 30. However, the use of the low-conductive plate 210 may not always be required, especially in situations where other precautionary measures are taken to protect against electric shock and short circuits.

As shown in FIGS. 1–2A, the low-conductive plate 210 includes an aperture through which the diode 30 protrudes. According to an exemplary embodiment, this opening in the low-conductive plate 210 provides a close fit for the protruding diode 30. Furthermore, in the particular exemplary embodiment where the diode light source 30 is being tested by an integrating sphere 40, the front of the low-conductive plate 210 may be painted white, or otherwise given the same light reflective characteristics of the interior surfaces of the integrating sphere 40. Accordingly, the front surface of the low-conductive plate 210 may act as an extension of the interior surface of the integrating sphere 40 for any gaps between the opening in the integrating sphere 40 (located at testing position 150) and the diode light source 30, when testing is performed.

In the exemplary embodiments illustrated by FIGS. 1–2A, the quick attachment device is configured to allow for a single diode light source 30 to be tested at a particular time. However, according to the exemplary embodiments, the quick attachment device may be configured to allow for multiple diode light sources 30 to be tested simultaneously. For example, multiple diodes 30 may be affixed to the mounting plate 220, and the low-conductive plate 210 may be configured with multiple openings for the plurality of diode light sources 30 being tested. It would be readily apparent to those of ordinary skill in the art the various ways that the mounting assembly 20 and the quick attachment module 10 may be configured to allow for the simultaneous testing of multiple diodes 30.

In addition, various modifications may be made to the embodiments of the quick attachment device shown in FIGS. 1–2B to be compatible with other types of surface-mounted LED packages. For example, the present invention covers quick attachment devices for testing various types of LED components with power leads, e.g., attached to TO-66 power packages. Modifications to the above embodiments to provide compatibility with such LED devices will be readily apparent to those of ordinary skill in the art.

As shown in FIGS. 1A, 1B, 2A and 2B, the equipment used to perform testing on the diode light sources 30 may be an integrating sphere 40 that takes one or more measurements, including but not limited to, total flux, primary wavelength, color purity, photopic response, and chromaticity. However, the present invention may be used in connection with other types of diode measurement devices for taking bench measurements. For example, such devices may include various types of tubular probes.

The quick attachment device may further include means for providing power to the diode light sources 30 during testing. The power source may be located on the quick attachment device (e.g., a battery pack connected to the mounting assembly). Alternatively, an external source may be used.

Exemplary embodiments of the present invention are directed to means for performing repeated testing on a plurality of diode light sources 30, which is both quick and accurate. Accordingly, it will be advantageous for the power source to be quickly connected to, and disconnected from, each of the diode light sources 30.

Some types of diode light sources 30 are equipped with power interfaces that utilize solder pads. The process of soldering power leads to these solder pads to provide power to the diode light source 30 is time consuming, and may result in exposed power connections creating a possible electrical hazard.

Therefore, in an exemplary embodiment, the non-conductive plate 210 may further be configured as a power supplying device for use with diode light sources 30, whose power interface utilizes solder pads. FIGS. 3–4C illustrate the components and configuration of such a power supply device, according exemplary embodiments.

Figure 3A:
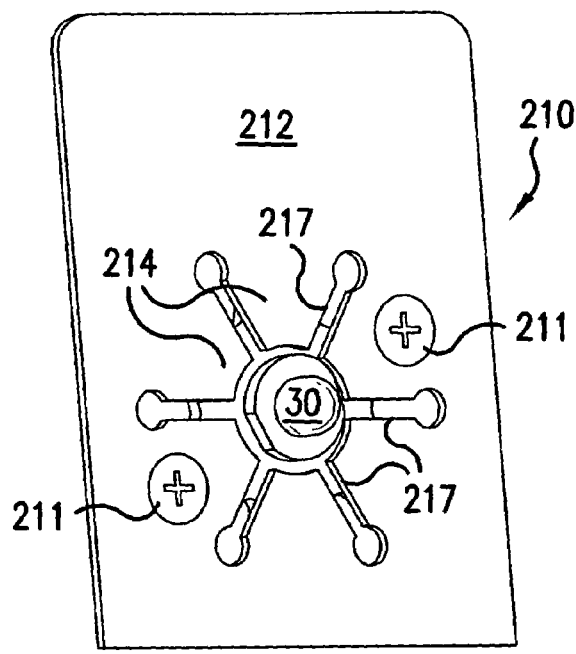
FIGS. 3A–3C illustrate the various components of a low-conductive power card configured to supply power to a surface-mounted diode light source with a star configuration, according to an exemplary embodiment of the present invention.
Figure 3B:
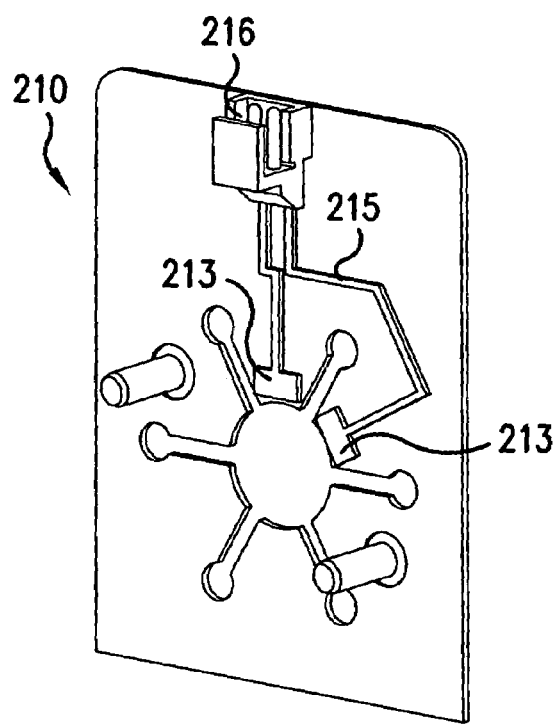
Figure 3C:
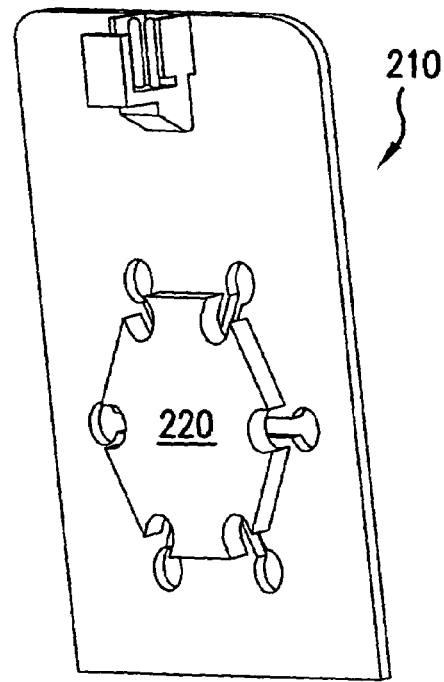
Figure 4A:
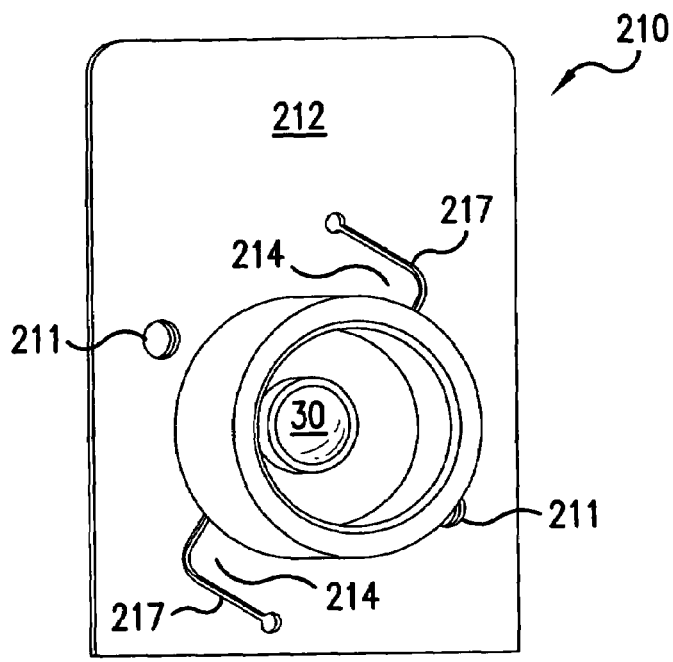
FIGS. 4A–4C illustrate the various components of a low-conductive power card configured to provide power to a surface-mounted diode light source with a star-O configuration, according to an exemplary embodiment of the present invention.
Figures 4B, 4C:
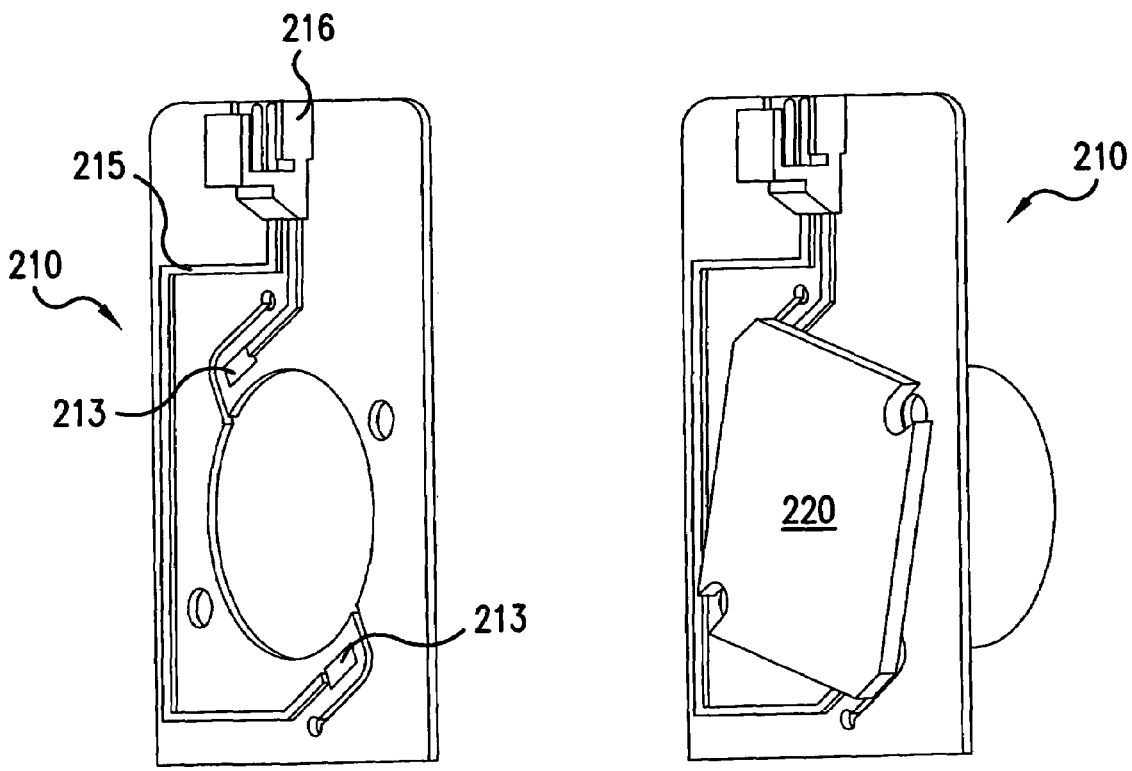

In particular, FIGS. 3A–3C illustrate a particular exemplary embodiment where the diode light source 30 has a star configuration, e.g., is a LUXEON Star emitter. FIGS. 4A–4C illustrate another particular exemplary embodiment in which the low-conductive plate 210 is a power supply device for a diode light source 30 having a star/O configuration, e.g., a LUXEON Star/O emitter.

FIGS. 3A–4C are provided in order to illustrate two particular exemplary embodiments. While the power supply device 210 is not limited to such embodiments, these FIGS. provide a general understanding of the components and principles related to a power supply device 210 for diode light source modules, whose power interface utilizes solder pads.

Referring to FIGS. 3A and 4A, the power supply device 210 includes a substrate 212, which is formed of a material exhibiting little or no electrical conductivity. For example, the substrate may be comprised of a semiconductor material normally used in printed circuit boards (PCBs). According to an exemplary embodiment, the material in substrate 212 exhibits some flexibility, as will be described below.

As shown in FIGS. 3A and 4A, the power supply device 210 further includes flexible tabs 214. According to an exemplary embodiment, these tabs 214 are formed as a result of the presence of slits 217. The slits 217 allow the tabs 214 to be displaced from its normal position. When one of the tabs 214 is displaced, a spring-loaded tension is created based on the tendency of the tab 214 to return to its original state.

FIGS. 3A and 4A illustrate the front surface of the power supply device 210. Particularly, when this power supply device 210 is affixed to the mounting assembly 20 of the quick attachment device, the front surface illustrated in FIGS. 3A and 4A will be the surface facing the quick attachment module 10. FIGS. 3B–3C and FIGS. 4B–4C illustrate the reverse surface, i.e., the surface facing the mounting plate 220 on the mounting assembly 20.

FIGS. 3B and 4B show two solder pad contacts 213, each being located on one of the tabs 214. Each of the two solder pad contacts 213 is connected to an electrical trace or pathway 215 that leads to power connector 216. Accordingly, one of the contact pads 213 is connected to the positive terminal of power connector 216, while the other is connected to the negative terminal. The terminals of power connecter 216 are connected to the leads for the power supply.

Figure 5:
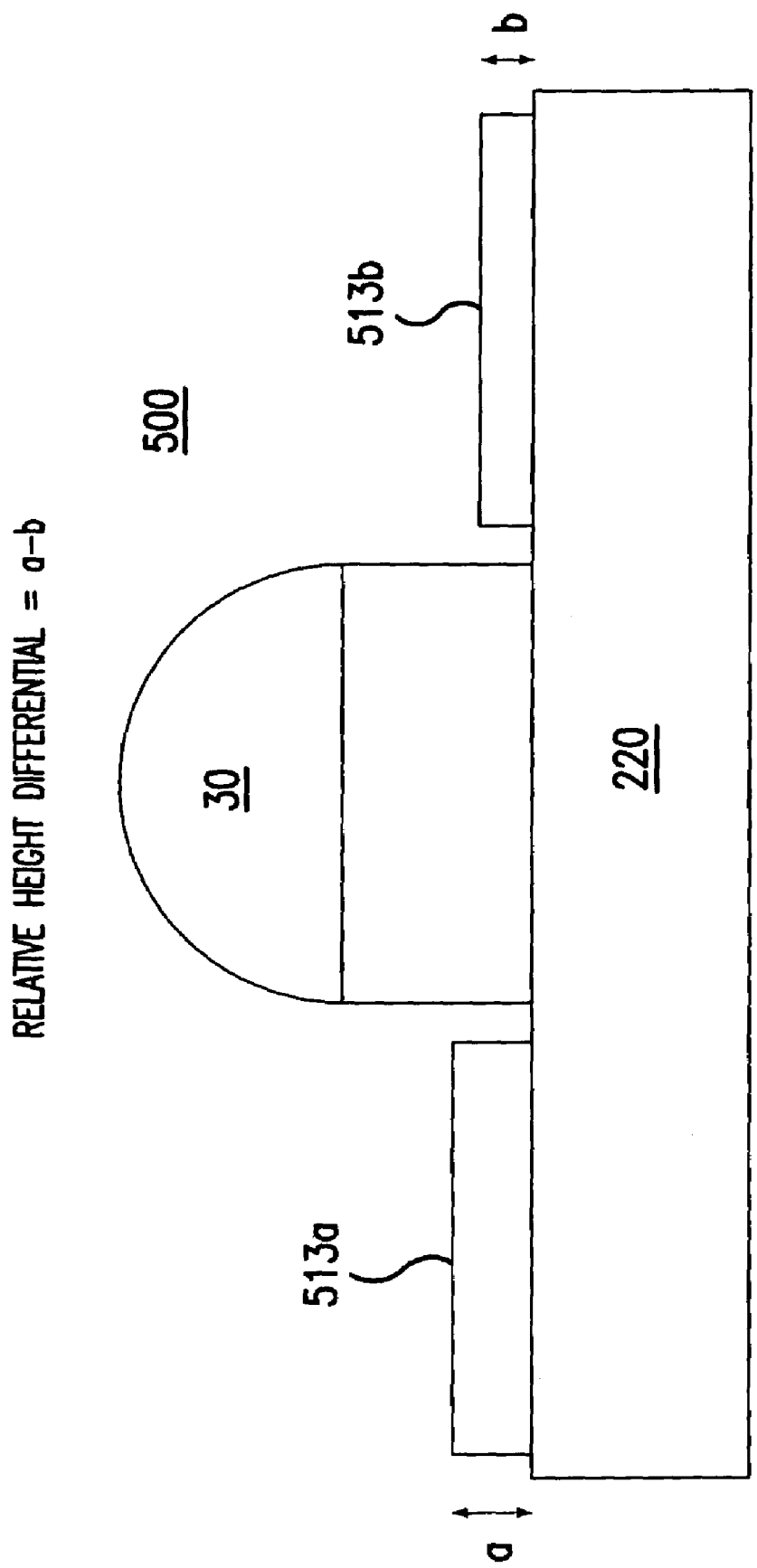
FIG. 5 illustrates a profile view of a diode light source using solder pads for a power interface, according to an exemplary embodiment of the present invention.

The placement of contact pads 213 on flexible tabs 214 allow for the power supply device 210 to compensate for a relative height differential with respect to the solder pads of a diode light source module. FIG. 5 illustrates a profile view of a diode light source module utilizing a solder pad type power interface, according to an exemplary embodiment. In particular, FIG. 5 illustrates a profile view of a diode light source module 500 (e.g., a surface-mounted LED), whose mounting plate 220 acts as a base. In particular, a power interface of the module 500 includes solder pads 513A and 513B. Because of, for example, a manufacturing defect or gradual wear, the height a of solder pad 513A is greater than the height b of solder pad 513B. The difference between heights a and b (a–b) may be referred to as a relative height differential between solder pads 513A and 513B.

In order for the solder pad contacts 213 of power supply device 210 to remain in contact with the corresponding solder pads 513A and 513B of the diode light source module 500, each of the solder pad contacts 213 are located on one of the flexible tabs 214. Thus, based on this spring-loaded tension of the tabs 214, each tab 214 will be displaced a necessary distance in order for the corresponding solder pad contacts 213 to remain in contact with, and provide power to, the corresponding solder pads 513A and 513B. Thus, the presence of these flexible tabs 214 on the power supply device 210 provide a degree of tolerance with respect to a relative height differential of solder pads 513A and 514A of the diode light source module 500.

As shown in FIGS. 3A and 4A, the design and configuration of flexible tabs 214 and solder pad contacts 213 at the power supply device 210 may be dependent on the configuration of the diode light source module 500 being tested. In particular, the location of the solder pad contacts 213 on the substrate 212 should correspond to solder pads 513A and 514B on the mounting plate 220 of diode light source module 500. The tabs 214 may be designed using slits 217 in order to provide the necessary displacement and spring-loaded tension. Methods for designing such tabs will be readily apparent to those of ordinary skill in the art.

According to an exemplary embodiment, the power supply device 210 is mounted to the mounting plate 220, e.g., by driving screws through screw holes 211. The location of the screw holes 211 is aligned with the location of corresponding screw holes in the mounting plate 220 at the diode light source module 500 being tested. FIGS. 3C and 4C illustrate that the power supply device 210 being affixed to the mounting plate 220 by such means. However, alternative mechanisms that provide for relatively quick mounting of the power supply device 210 to the mounting plate 220 may be used, as will be contemplated by those of ordinary skill in the art.

According to an exemplary embodiment, the power connections 215 of the power supply device 210 may be electrically insulated. For example, these electrical pathways 215 may be covered by an insulating electrical tape, or other suitable insulating material, on the rear surface of the power supply device 210. Furthermore, the low-conductive material used in substrate 212 will insulate these pathways 215 from any conductive surface in contact with the power supply device's 210 front surface.

In the above exemplary embodiments, which are illustrated in FIGS. 3A–4C, the power supply device is implemented as the low-conductive plate 210 of the mounting assembly 20 in the quick attachment device of FIGS. 1–2C. However, it should be noted that this power supply device is not limited to such an application, and may be utilized apart from the quick attachment device. Furthermore, the power supply device described above is not limited to the testing of diode light sources.

In the above exemplary embodiments, which are illustrated in FIGS. 3A–4C, the power supply device is implemented as the low-conductive plate 210 of the mounting assembly 20 in the quick attachment device of FIGS. 1–2C. However, it should be noted that this power supply device is not limited to such an application, and may be utilized apart from the quick attachment device. Furthermore, the power supply device described above is not limited to the testing of diode light sources.

For example, the power supply device described above in connection with FIGS. 3A–4C may be utilized to provide power to a diode light source module 500 utilizing solder pads in any type of application, especially those in which the ability to quickly replace the module 500 with the advantageous.

Furthermore, such a power device may be easily adapted to provide a permanent power connection for a diode light source module by soldering the contacts 213 to the corresponding solder pads 513A and 513B. Such a modification may be advantageous when insulation of the power connections to the module 500 is required.

It should be noted that the above-described power supply device 210 may be modified for use with LED devices other than the LUXEON Star and Star/O emitters. According to such modifications, the power supply device 210 may be operable to provide power to LED devices attached to TO-66 power packages, and other types of leaded LED components. These and similar modifications will be readily apparent to those of ordinary skill in the art.

What is claimed:

1. A quick attachment device for placing one or more diode light sources into position for repeatable testing, the device comprising:
    a quick attachment module whose location is fixed with respect to the repeatable testing position, the quick disconnect assembly including
        a quick disconnect hinge, and
        two locating pins; and
    a mounting assembly on which the diode light sources are mounted during testing, the mounting assembly being operably connected to the quick disconnect hinge to move the diode light sources into and out of the repeatable testing position, the mounting assembly including a thermo-electric cooling device operable to cool the diode light sources, wherein the mounting assembly is configured to receive the locating pins in a locational transition (LT) fit connection when the diode light sources are moved into the repeatable testing position.

2. The device of claim 1, wherein the mounting assembly includes
a thermally insulating module including two slots, each slot being configured to receive a corresponding one of the locating pins in an LT fit connection when the diode light sources are moved into repeatable testing position.

3. The device of claim 2, wherein
the thermally insulating module is comprised of two modular wear blocks, the modular wear blocks comprising a thermally insulating material, each of the modular wear blocks including a corresponding one of the slots.

4. The device of claim 1, further comprising:
a thermistor configured to detect a temperature of the mounting assembly, wherein the thermoelectric cooling device is controlled based on the detected temperature.

5. The device of claim 4, wherein the thermo-electric cooling device is configured to maintain each of the diode light sources at a junction temperature during testing.

6. The device of claim 1, wherein the mounting assembly includes,
a heat sink configured to dissipate heat for a mounting plate in the mounting assembly, the diode light sources being mounted on the mounting plate.

7. The device of claim 6, wherein the mounting assembly includes,
an electric fan operably connected to the heat sink.

8. The device of claim 1, wherein
the quick attachment module includes a fastening mechanism, and
the mounting assembly includes a fastener configured to engage with the fastening mechanism when the diode light sources are moved into repeatable testing position.

9. The device of claim 8, wherein
the fastening mechanism comprises a second quick disconnect hinge.

10. The device of claim 1, wherein the mounting assembly includes a mounting plate on which the diode light sources are mounted, the thermo-electric cooling device being controlled based on the temperature of the mounting plate.

11. The device of claim 10, further comprising:
a heat sink operably connected to the diode light sources and the mounting plate, the heat sink being configured to transfer heat generated at the diode light sources during testing to the mounting plate.

12. The device of claim 11, further comprising:
a thermistor operably configured to detect the temperature of the mounting plate and output a signal for controlling the thermo-electric cooling device.

13. The device of claim 10, wherein the mounting assembly includes,
a low-conductive plate configured to electrically insulate electrical pathways of the diode light sources from the quick attachment module during testing, the electrical pathways operable to provide power to the diode light sources.

14. The device of claim 13, the diode light sources having a solder pad configuration, wherein the low-conductive plate is a printed circuit board (PCB) card configured to provide the electrically insulated electrical pathways from solder pads of the diode light sources to a power supply.

15. The device of claim 13, wherein the electrical pathways include at least one of connectors or pins of the diode light sources connected to a power supply.

16. The device of claim 1, wherein the quick attachment module is mounted on an integrating sphere, the repeatable testing position being within the integrating sphere.

17. The device of claim 16, the mounting assembly including a low-conductive plate configured to electrically insulate electrical pathways of the diode light device from the quick attachment module during testing, wherein a surface of the low-conductive plate facing the interior of the integrating sphere during testing is operable to reflect light emitted by the diode light sources.

18. The device of claim 1, wherein the diode light sources comprise one or more light-emitting diodes (LEDs) configured to emit at least one of visible, infrared (IR), and ultraviolet (UV) light.

19. The device of claim 1, wherein the diode light sources comprise at least one of infrared (IR) diodes, ultraviolet (UV) diodes, and laser diodes.

* * * * *